(12) United States Patent
Sakurai et al.

(10) Patent No.: US 6,198,120 B1
(45) Date of Patent: Mar. 6, 2001

(54) FERROELECTRIC THIN FILM DEVICE AND METHOD OF PRODUCING THE SAME

(75) Inventors: Atsushi Sakurai, Kyoto; Xiao-min Li, Shiga-ken; Kosuke Shiratsuyu, Omihachiman, all of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/249,360

(22) Filed: Feb. 12, 1999

(30) Foreign Application Priority Data

Feb. 13, 1998 (JP) .................................................. 10-048791
Jan. 25, 1999 (JP) .................................................. 11-015460

(51) Int. Cl.$^7$ .................................................. H01L 29/72
(52) U.S. Cl. .................. 257/295; 257/310; 257/532; 438/3; 438/240; 438/253
(58) Field of Search .................. 257/295, 310, 257/532; 438/3, 240, 253

(56) References Cited

U.S. PATENT DOCUMENTS 6,046,469 * 4/2000 Yamazaki et al. .................... 257/295

FOREIGN PATENT DOCUMENTS 09252094    9/1997 (JP) .

OTHER PUBLICATIONS

"Synthesis of Epitaxial Pt on (100)Si Using TiN Buffer Layer by Pulsed Laser Deposition"; P. Tiwari, et al.; American Institue of Physics, *Appl. Phys. Lett.*; 65 (21); Nov. 21, 1994; pp. 2693–2695.

* cited by examiner

Primary Examiner—Edward Wojciechowicz
(74) Attorney, Agent, or Firm—Ostrolenk, Faber, Gerb & Soffen, LLP (57) ABSTRACT

A ferroelectric thin film device comprises: a Si substrate; a TiN thin film epitaxially grown on the Si substrate in which Ti is partially substituted by Al; a metal thin film epitaxially grown on the TiN thin film; and a ferroelectric thin film grown and oriented on the metal thin film and composed of an oxide having a perovskite structure. The amount of Al substituted at Ti sites in the TiN thin film is about 1 to 30% in terms of Al atoms, and the oxygen content of the TiN thin film is about 5% or less in terms of oxygen atoms.

27 Claims, 13 Drawing Sheets

FERROELECTRIC THIN FILM DEVICE AND METHOD OF PRODUCING THE SAME

BACKGROUND OF THE INVENTION

1. Field of the Invention

The present invention relates to a ferroelectric thin film device having a Si substrate, and more specifically, relates to a ferroelectric thin film device comprising a highly-oriented ferroelectric thin film provided on a Si substrate, and suitable for use as capacitors for DRAM and ferroelectric RAM (Fe RAM), as well as for application to a pyroelectric element, a micro-actuator, a thin film capacitor, a small piezoelectric element, and the like. The present invention also relates to a production method for the ferroelectric thin film device.

2. Description of the Related Art

In recent years, studies have actively been conducted on formation of thin films of Pb type and non-Pb type perovskite compounds such as $BaTiO_3$ (abbreviated to "BTO" hereinafter), $SrTiO_3$ (abbreviated to "STO" hereinafter), $(Ba, Sr)TiO_3$ (abbreviated to "BSTO" hereinafter), $PbTiO_3$, $(Pb, La)TiO_3$ (abbreviated to "PLT" hereinafter), PZT, PLZT, $Pb(Mg, Nb)O_3$ (abbreviated to "PMN" hereinafter), and the like.

Particularly, when a Pb type perovskite compound having high residual polarization, such as PZT, PLZT, or the like can be epitaxially grown, spontaneous polarization can be arranged in one direction, thereby obtaining higher polarization values and switching characteristics. Therefore, under present conditions, application to a high-density recording medium is significantly increased, and there is thus a strong demand for developing a technique for epitaxially growing a Pb type perovskite compound.

However, in application in which spontaneous polarization is arranged in one direction, e.g., in the direction of the film thickness, a structure in which a ferroelectric thin film is held between conductive layers (electrode layers) on a Si substrate, i.e., a metal-ferroelectric material-metal (MFM) structure, is required. A triaxially-oriented ferroelectric oxide thin film having good crystallinity is difficult to obtain from the following reasons:

(1) When a metal thin film of Ag, Au or the like is formed as a conductor on a Si substrate, mutual diffusion occurs between the metal thin film and the Si substrate as a base during growth of the ferroelectric oxide thin film.

(2) A method using a Pt thin film as a metal thin film can be considered. Although Pt can be epitaxially grown on an oxide single crystal substrate such as MgO, $SrTiO_3$, or the like, direct epitaxial growth of Pt on a Si substrate cannot be realized at present.

(3) A method using an oxide such as $(La, Sr)CoO_3$ (abbreviated to "LSCO" hereinafter) for a conductive thin film can be considered. In this case, it is necessary to insert other layers between the Si substrate and the LSCO layer, for example, as in PLZT/LSCO/BiTO/YSZ/Si, thereby causing difficulties in improving epitaxy of the ferroelectric layer as the uppermost layer. Here, BiTO represents $Bi_4Ti_3O_{12}$, and YSZ represents $ZrO_2$ to which Y (yttrium) is added.

(4) There is also a method comprising forming a TiN thin film by ion beam deposition, forming $SrRuO_3$ (abbreviated to "SRO" hereinafter) as a buffer layer on the Pt thin film formed on the TiN thin film, and the epitaxially growing a $(Ba, Sr)TiO_3$ (BSTO) thin film thereon. This method has problems in that a multilayer structure of BSTO/SRO/Pt/TAN/Si causes a significant increase in cost, and deterioration in crystallinity with lamination of the thin films. In addition, SRO is considered to impart ferroelectricity to BSTO by applying a stress stain to BSTO, but there is now no success of growth of a Pb type perovskite compound.

For the forgoing reasons, there is a need for a ferroelectric thin film device comprising a ferroelectric thin film of a perovskite oxide, which is highly oriented and formed in a simple film structure on a Si substrate without requiring a complicated multilayer structure, and a method of producing a ferroelectric thin film device, which is capable of efficiently producing the ferroelectric thin film device.

SUMMARY OF THE INVENTION

The present invention is directed to a ferroelectric thin film device and a method of producing a ferroelectric thin film device that satisfied this need. The ferroelectric thin film device comprises: a Si substrate; a TiN thin film epitaxially grown on the Si substrate in which the Ti is partially substituted by Al; a metal thin film epitaxially grown on the TiN thin film; and a ferroelectric thin film grown and oriented on the metal thin film and composed of an oxide having a perovskite structure. The amount of Al substituted at Ti sites in the TiN thin film is about 1 to 30% in terms of Al atoms, and the oxygen content of the TiN thin film is about 5% or less in terms of oxygen atoms.

The method of producing a ferroelectric thin film device comprises the steps of: epitaxially growing, on a Si substrate, a TiN thin film in which the Ti is partially substituted by Al; epitaxially growing a metal thin film on the TiN thin film; and orienting and growing a ferroelectric thin film of an oxide having a perovskite structure on the metal thin film. The amount of Al substituted at the Ti sites in the TiN thin film is in the range of about 1 to 30% in terms of Al atoms, and the oxygen content of the TiN thin film is about 5% or less in terms of oxygen atoms.

According to the present invention, it is possible to obtain the element having a structure in which the ferroelectric thin film is oriented and grown on the Si substrate without requiring a complicated multilayer structure.

Namely, although a complicated multilayer structure is conventionally required for orienting and growing a perovskite type oxide ferroelectric thin film on the Si substrate, the construction of the present invention enables epitaxial growth of the perovskite type oxide ferroelectric thin film on the Si substrate by using only two buffer layers including the TiN thin film and the metal thin film.

Particularly, the present invention enables growth of a Pb perovskite type oxide ferroelectric thin film having a high degree of orientation (at least monoaxial orientation).

In addition, when a Pt thin film is formed as the metal thin film, the Pt thin film also functions as an oxidation barrier layer for the TiN thin film, and exhibits a catalytic ability in the process for forming the ferroelectric thin film, thereby obtaining the ferroelectric thin film having excellent crystallinity.

Furthermore, when the ferroelectric thin film is epitaxially grown, all thin films are epitaxial films, and thus mutual diffusion does not occur at the interfaces between the respective thin films, thereby obtaining the ferroelectric thin film device which is thermally stable.

Furthermore, the present invention permits epitaxial grown of the perovskite type oxide ferroelectric thin film on the Si substrate by using only two buffer layers including the TiN thin film and the metal thin film, thereby decreasing the process time and production cost.

As a result, it is possible to easily realize epitaxial growth of a perovskite type oxide ferroelectric material, particularly a Pb type perovskite compound, on the single crystal Si substrate, which is conventionally very difficult, and thus provide a ferroelectric thin film device which can be applied to capacitors for DRAM and FeRAM, a pyroelectric element, a micro-actuator, a thin film capacitor, a small piezoelectric element, and the like.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Embodiments of the ferroelectric thin film device of the present invention and the production method therefor will be described below with reference to examples.

Figure 1:
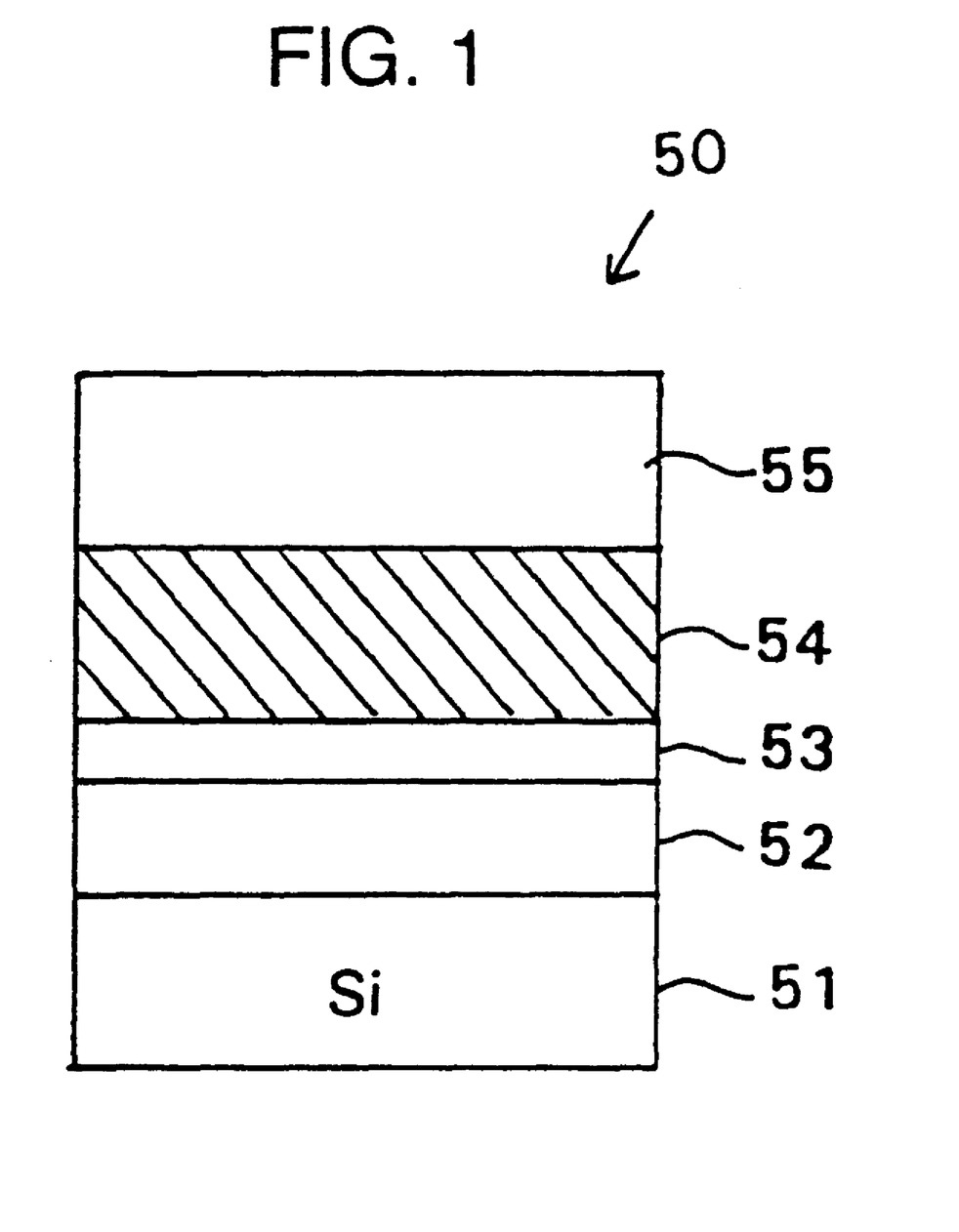
FIG. 1 is a schematic cross sectional view showing a ferroelectric thin film device of the present invention.

As shown in FIG. 1, a ferroelectric thin film device 50 of the present invention comprises a Si substrate 51, a TiN thin film 52 epitaxially grown on the Si substrate 51, a metal thin film 53 epitaxially grown on the TiN thin film 52 and a ferroelectric thin film 54 epitaxially grown on the metal thin film 53 and composed of an oxide having a perovskite structure. In the TiN thin film 52, the Ti is partially substituted by Al, and the amount of Al substituted at the Ti sites in the TiN thin film 52 is about 1 to 30% in terms of Al atoms, and the oxygen content of the TiN thin film is about 5% or less in terms of oxygen atoms. The ferroelectric thin film device 50 may further comprises a metal film 55 on the ferroelectric thin film 54 so that the ferroelectric thin film device 50 has a suitable structure in accordance with its application.

In the above construction, the ferroelectric oxide thin film 54 oriented and grown on the Si substrate 51 and having perovskite structure can be formed with only two buffer layers including the TiN thin film 52 and the metal thin film 53, without requiring a complicated multilayer structure. It is thus possible to obtain the ferroelectric thin film device which can be applied to capacitors of DRAM and FeRAM, as well as a pyroelectric element, a micro-actuator, a thin film capacitor, a small piezoelectric element, and the like.

In the ferroelectric thin film device 50 of the present invention, the TiN thin film 52 and the metal thin film 53 are epitaxially grown on the Si substrate 51. This makes it possible for the ferroelectric thin film 54 which is formed on the TiN thin film 52 and the metal thin film 53 to grow with high orientation, thereby obtaining good electric properties.

In the present invention, the reason why the amount of Al substituted at the Ti sites in the TiN thin film 52 is in the range of about 1 to 30% is that with an amount of Al substituted of less than about 1%, sufficient oxidation resistance cannot be obtained, and with an amount of Al substituted of over about 30%, conductivity of TiN significantly deteriorates.

When the oxygen content of TiN exceeds about 5% by weight, oxidation resistance deteriorates and satisfactory epitaxial growth is inhibited. Therefore, the oxygen content of TiN is preferably about 5% or less, more preferably about 1% or less.

The metal thin film 53 preferably comprises at lease one selected from the group consisting of Au, Pt, Pd, Rh, Ir and Ru, at a content of 50% or more. In order to orient and grow the ferroelectric thin film 54, generally, the ferroelectric thin film 54 must be grown in an atmosphere of 600° C. or more. It is thus preferable to use, as the metal thin film, a material containing a noble metal such as Au, Pt, Pd, Rh, Ir and Ru, or an alloy composed of at least two metals. Particularly, the metal content is preferably not less than about 50%. In the case where Pt is used for the metal thin film 53, the Pt thin film has a lattice constant suitable for epitaxial growth on the TiN thin film 52, functions as an oxidation barrier layer for TiN, and has a lattice constant suitable for epitaxial growth of the ferroelectric thin film 54, and Pt has a catalytic function, thereby obtaining the ferroelectric thin film 54 having excellent crystallinity.

It is preferable that the ferroelectric thin film 54 comprises a Pb type perovskite oxide thin film. This is because the Pb type perovskite oxide thin film has excellent properties and is suitable to be highly oriented (at least monoaxially oriented). The Pb type perovskite oxide preferably comprises Pb or Pb and at least La as a component element at A site represented by $ABO_3$, and at least one element of Ti, Zr, Mg and Nb as a component element of B site. This is because a material composition having properties including a high residual polarization value as an index of ferroelectricity and a small electric field (anti-electric field) required for reversing polarization can be obtained.

The TiN thin film 52 preferably has a thickness in the range of about 100 to 1000 nm, the metal thin film 53 preferably has a thickness in the range of about 10 to 200 nm, and the ferroelectric thin film 54 preferable has a thickness in the range of about 50 to 3000 nm. The reason why the aforementioned thickness of the TiN thin film 52 is preferable is that with a thickness of less than about 100 nm, the stress of the TiN is not sufficiently transmitted to the ferroelectric thin film 54, while with a thickness of over about 1000 nm, film deposition requires much time and is thus unpractical.

Why the aforementioned thickness of the metal thin film 53 is preferable is that with a thickness of less than about 10 nm, the effect as a protective film for TiN deteriorates and a continuous film is difficult to form, while with a thickness of over about 200 nm, the stress of the TiN thin film is not sufficiently transmitted to the ferroelectric thin film.

Further, if the thickness of the ferroelectric thin film 54 is less than about 50 nm, the ferroelectric thin film 54 does not show the ferroelectric properties in the same degree as the bulk ferroelectric material does. If the thickness of the ferroelectric thin film 54 is greater than about 3000 nm, the stress of the TiN thin film 52 is not sufficiently transmitted to the ferroelectric thin film 54.

In the present invention, the ratio of the thickness of the metal thin film 53 to the thickness of the TiN thin film 52 is preferably about 0.5 or less, and the ratio of the thickness of the ferroelectric thin film 54 to the thickness of the TiN thin film 52 is preferably about 3 or less. The reason for this is that when the ratio of the thickness of the metal thin film 53 to the thickness of the TiN thin film 52 exceeds about 0.5, the stress of TiN is not sufficiently transmitted to the ferroelectric thin film 54, and similarly, when the ratio of the thickness of the ferroelectric thin film 54 to the thickness of the TiN thin film 52 exceeds about 3, the stress of the TiN thin film 52 is not sufficiently transmitted to the ferroelectric thin film 54.

In the case where the metal thin film 53 is made of Pt, the ratio of the thickness of the Pt thin film to the thickness of the TiN thin film is preferably about 0.4 or less. This is because, with a thickness ratio of over 0.4, the stress of the TiN thin film is not sufficiently transmitted to the ferroelectric thin film.

The ferroelectric thin film 54 is preferably formed by epitaxial growth. In the case, all thin films comprise epitaxial films, and substantially no mutual diffusion occurs at the interfaces between the respective thin films, thereby obtaining a ferroelectric thin film device which is thermally stable.

The TiN thin film 52 is preferably formed by a pulsed laser deposition method (PLD method), or an ion beam sputtering method. When the TiN thin film 52 is formed by the pulsed laser deposition method or ion beam sputtering method, the TiN thin film 52 can easily epitaxially be grown on the Si substrate 51 within a short time, thereby making the present invention more practical. In the case, it is preferable that the TiN thin film 52 is formed by the pulsed laser deposition method (PLD method) under a pressure of $10^{-6}$ Torr or less, or the ion beam sputtering method under a pressure of $10^{-3}$ Torr or less.

The Pt thin film is preferably formed by a sputtering method. The use of the sputtering method for forming the Pt thin film enables easy epitaxial growth of the Pt thin film on the TiN thin film 52, as well as secure formation of the ferroelectric thin film on the Pt thin film, thereby obtaining a ferroelectric thin film device having desired properties. In this case, the Pt thin film is preferably formed by the sputtering method in an Ar gas atmosphere containing 0.01% by volume or less of oxygen.

The ferroelectric thin film 54 is preferably formed by a chemical vapor deposition method. When the ferroelectric thin film is formed by the chemical vapor deposition method, the ferroelectric thin film 54 can easily be epitaxially grown in a large area on the metal thin film, thereby making the present invention more practical.

EXAMPLES

A TiN thin film, a Pt thin film, and a Pb type perovskite ferroelectric oxide thin film were formed in this order on a Si single crystal substrate, from which the natural oxide film was removed, by the method of each of examples and a comparative example, which will be described below, to produce a ferroelectric thin film device comprising an oriented ferroelectric thin film.

Then, an Au upper electrode having a diameter of 0.5 mm was formed on the Pb type perovskite ferroelectric oxide thin film by the vapor deposition method using a mask, and the electric characteristics of the ferroelectric thin film device were evaluated.

Example 1

Si (100) having a thickness of 50.8 mm was used as a silicon substrate. However, in the present invention, the Si substrate is not limited to Si (100), and Si (111) and Si (110) can also be used. Any one of these Si substrates can be used as long as the miss-cut angle is 5% or less.

The Si (100) substrate was ultrasonically cleaned in an organic solvent such as acetone, ethanol, or the like, and then dipped in a 10% HF solution to remove the oxide film from the surface of the Si substrate.

Then, a TiN thin film in which the Ti sites were partially substituted by Al (abbreviated to "the TAN thin film" thereinafter) was epitaxially grown to a thickness of about 500 nm by a pulsed laser deposition (PLD) apparatus in a vacuum under conditions including a substrate temperature of 550 to 650° C., a laser cycle frequency of 5 to 10 Hz and a laser energy density of 4.5 J/cm$^2$ (KrF). As a result of measurement of the oxygen content of the thus-obtained TAN [$(Ti_{0.9}Al_{0.1})N$] thin film by Auger electron spectroscopy (AES), the oxygen content was 1% or less in terms of oxygen atoms.

Figure 2:
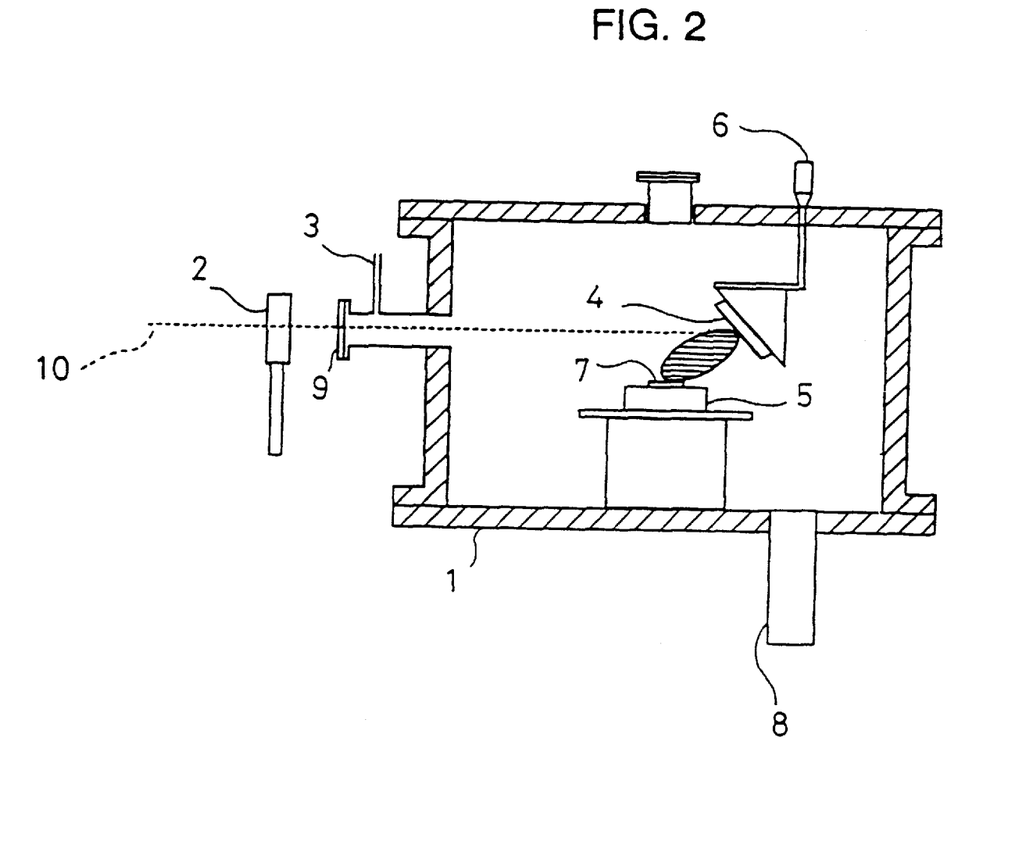
FIG. 2 is a schematic drawing of a PLD apparatus used for forming TAN, PLT and BSTO thin films in examples and a comparative example of the present invention.

In Example 1, the TAN thin film was deposited by using such a PLD apparatus as shown in FIG. 2. The PLD apparatus comprises a vacuum container 1 provided with a gas inlet tube 3 for introducing an atmospheric gas into the container, and an exhaust port 8 for exhausting the inner atmospheric gas, and a target 4 and a substrate heater 5 for heating the substrate, both of which are provided in the vacuum container 1, so that an excimer laser beam 10 passing through a laser condensing lens 2 is introduced into the vacuum container 1 through a synthetic quartz window 9.

As the target for forming the TAN thin film, a TAN sintered compact represented by the composition formula $(Ti_{0.9}Al_{0.1})N$ was used.

Besides the PLD method, the TAN thin film can also be formed by an electron beam deposition method, a rf sputtering method, a DC sputtering method, an ion beam sputtering method, an ECR sputtering method, a MBE method, or the like. Furthermore, an ion beam or a laser beam can be used for assisting the formation of the TAN thin film in order to improve crystallinity.

The Pt thin film was epitaxially grown to a thickness of 100 nm on the TAN thin film by a rf magnetron sputtering apparatus under conditions including a total pressure of 2 mTorr (oxygen partial pressure 0.2 mTorr) and a substrate temperature of 600° C.

Besides the rf magnetron sputtering method, the Pt thin film can be formed by an electron beam deposition method, a rf sputtering method, a DC sputtering method, an ion beam sputtering method, an ECR sputtering method, or the like.

Then, a $Pb(Zr_{0.52}Ti_{0.48})O_3$ (abbreviated to "PZT" hereinafter) thin film was epitaxially grown to a thickness of 400 to 600 nm on the Pt thin film by a MOCVD apparatus under conditions including a total pressure of 10 Torr (oxygen partial pressure 5 Torr) and a substrate temperature of 700° C. As precursors of Pb, Zr and Ti, $Pb(DPM)_2$, $Zr(O-t-C_4H_9)_4$, and $Ti(O-i-C_3H_7)_4$ were respectively used.

Figure 3:
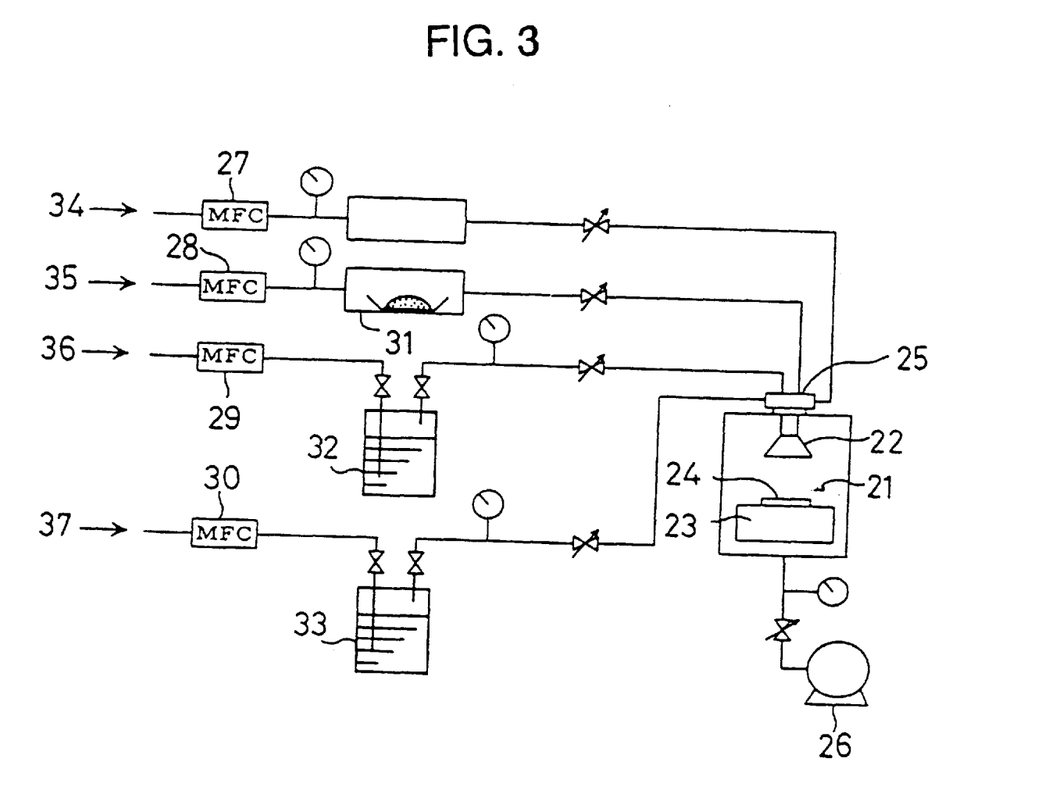
FIG. 3 is schematic drawing of a MOCVD apparatus used for forming a PZT thin film in examples and comparative examples of the present invention.

In Example 1, the PZT thin film was formed by such a MOCVD apparatus as shown in FIG. 3. The MOCVD apparatus comprises a vacuum container 21 which can be evacuated by a vacuum pump 26, a gas blowout nozzle 22 for supplying gases from a gas mixer 25 into the vacuum container 21, and a substrate heater 23 for heating a substrate 24. The MOCVD apparatus also comprises a solid vaporizer 31 for vaporizing $Pb(DPM)_2$ (solid) as a precursor of Pb, a liquid vaporizer 32 for vaporizing $Zr(O-t-C_4H_9)_4$ (liquid) as a precursor of Zr, and a liquid vaporizer 33 for vaporizing $Ti(O-i-C_3H_7)_4$ (liquid) as a precursor of Ti so that the thin film raw material gases of Pb, Zr and Ti generated in the solid vaporizer 31 and the liquid vaporizers 32 and 33 are sent to the vacuum container 21 by Ar gas (carrier gas), and 30, respectively, and $O_2$ gas is supplied to the vacuum container 21 through a mass flow controller 27.

Table 1 shows detailed conditions for forming the PZT thin film.

TABLE 1

| Items | Vaporization temperature (° C.) | Flaw rate of carrier gas (SCCM) | Vaporizer pressure (Torr) |
| --- | --- | --- | --- |
| Pb raw material | 135 | 200 (Ar) | 10 |
| Zr raw material | 35 | 50 (Ar) | 10 |
| Ti raw material | 50 | 50 (Ar) | 50 |
| Oxygen gas | — | 500 (Ar) | — |

Comparative Example 1

A TAN thin film ($Ti_{0.9}Al_{0.1}N$: TAN) was epitaxially grown to a thickness of about 150 nm on a Si (100) substrate by the same PLD method as Example 1 under conditions in which the pressure was about $10^{-5}$ Torr higher than Example 1, the substrate temperature was 550 to 650° C., the laser cycle frequency was 5 Hz, and the laser energy density was 4.5 J/cm² (KrF). As a result of measurement of the oxygen content of the thus-obtained TAN thin film by the same Auger electron spectroscopy as Example 1, the oxygen content was about 10% in terms of oxygen atoms.

Then, the Pt thin film was epitaxially grown to a thickness of 100 nm on the TAN thin film by the same rf magnetron sputtering apparatus as Example 1 under conditions including a total pressure of 2 mTorr (oxygen partial pressure 0.2 mTorr) and a substrate temperature of 600° C.

Then, a $Pb(Zr_{0.52}Ti_{0.48})O_3$ (abbreviated to "PZT" hereinafter) thin film was epitaxially grown to a thickness of 500 to 600 nm on the Pt thin film by the same MOCVD method as Example 1 under conditions including a total pressure of 10 Torr (oxygen partial pressure 5 Torr) and a substrate temperature of 600° C.

Comparison between Example 1 and Comparative Example 1

Figure 4:
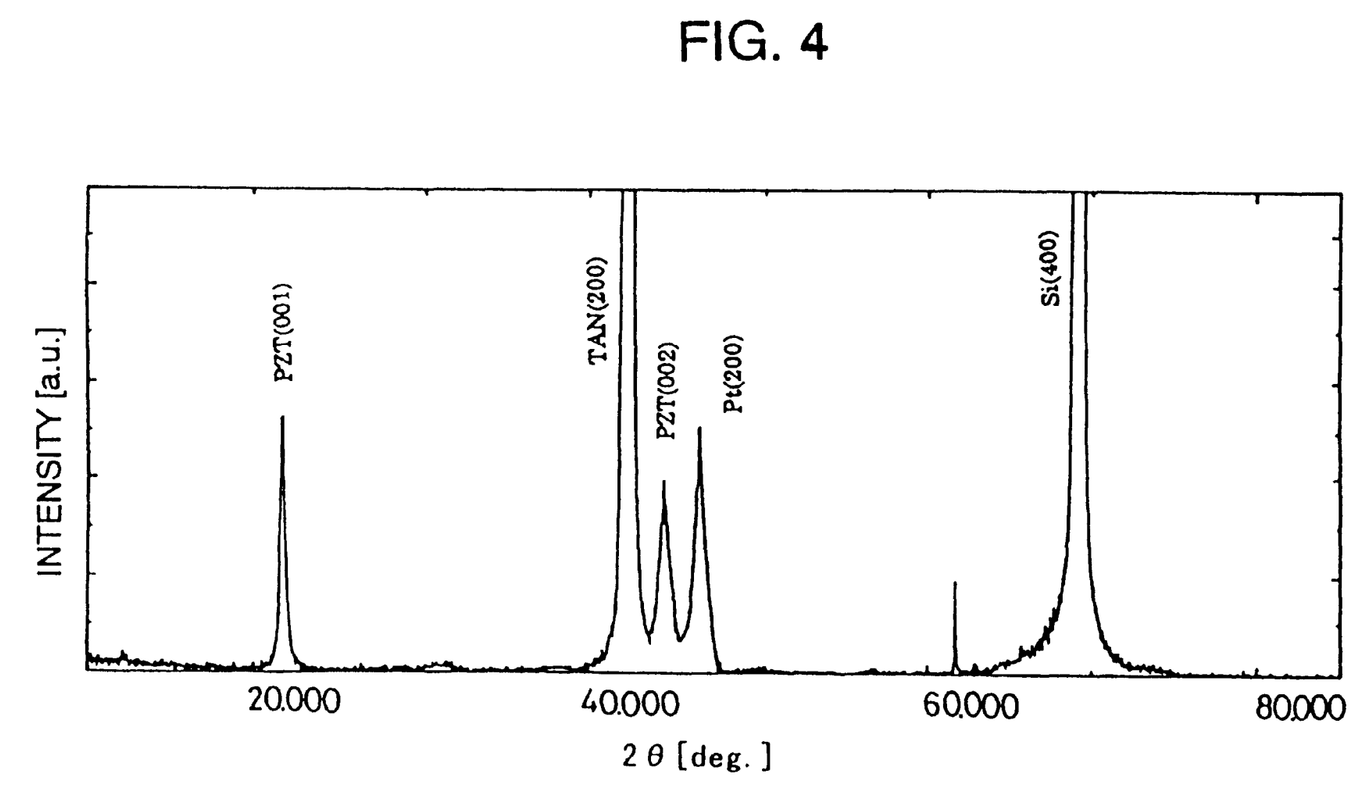
FIG. 4 is a chart showing a XRD pattern of PZT/Pt/TAN thin films formed in Example 1 of the present invention.
Figure 5:
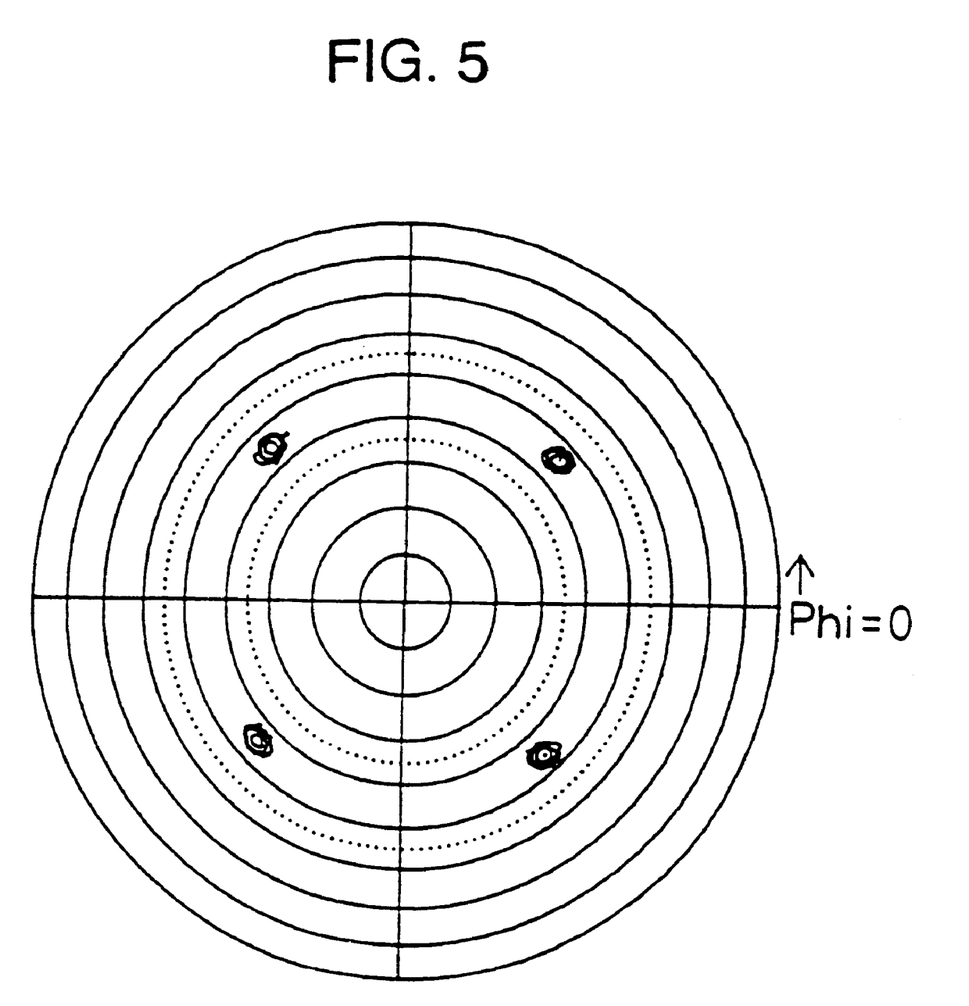
FIG. 5 is a pole figure of the TAN thin film formed in Example 1.

FIG. 4 shows a XRD pattern of the PZT/Pt/TAN thin films formed on the Si substrate in Example 1. FIG. 5 shows the results of pole figure analysis for examining orientation in the film plane of the same sample. This analysis was carried out for TAN (220), and peaks of four-fold symmetry were obtained. This indicates that the TAN thin film is epitaxially grown on the Si substrate.

Figure 6:
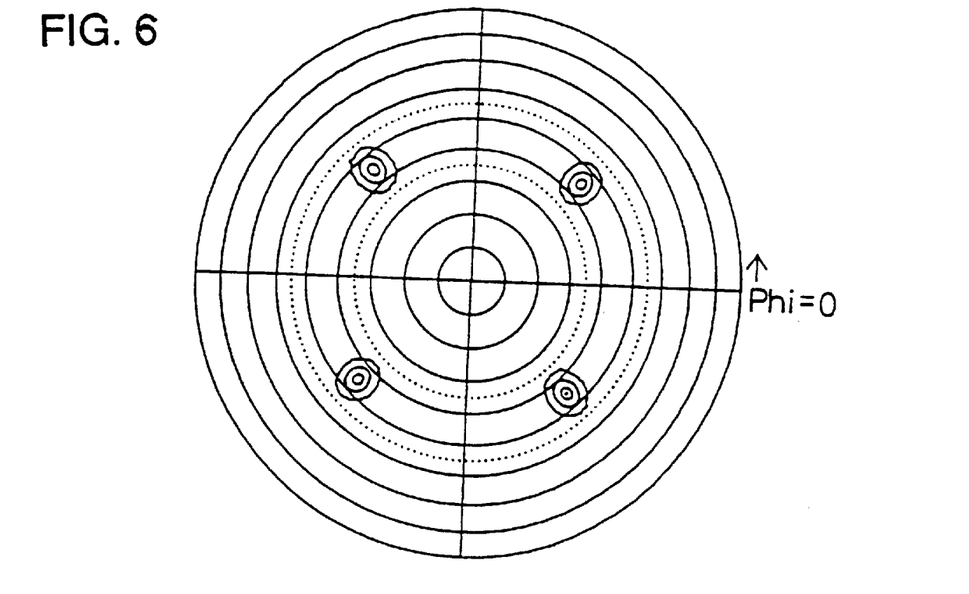
FIG. 6 is a pole figure of the Pt thin film formed in Example 1.
Figure 7:
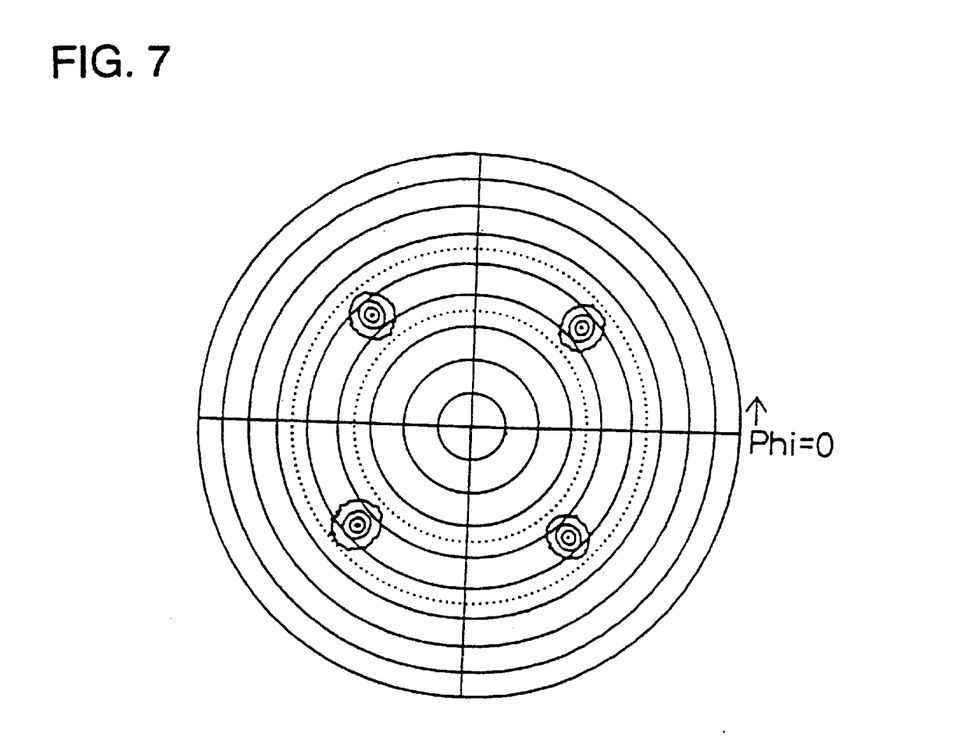
FIG. 7 is a pole figure of the PZT thin film formed in Example 1.

FIG. 6 shows the results of pole figure analysis for Pt (200) of the same sample, and FIG. 7 shows the results of pole figure analysis for PZT (220).

FIGS. 6 and 7 show that Pt peaks of four-fold symmetry and PZT peaks of four-fold symmetry are obtained. This also indicates that the Pt thin film and the PZT thin film are also epitaxially grown.

Figure 8:
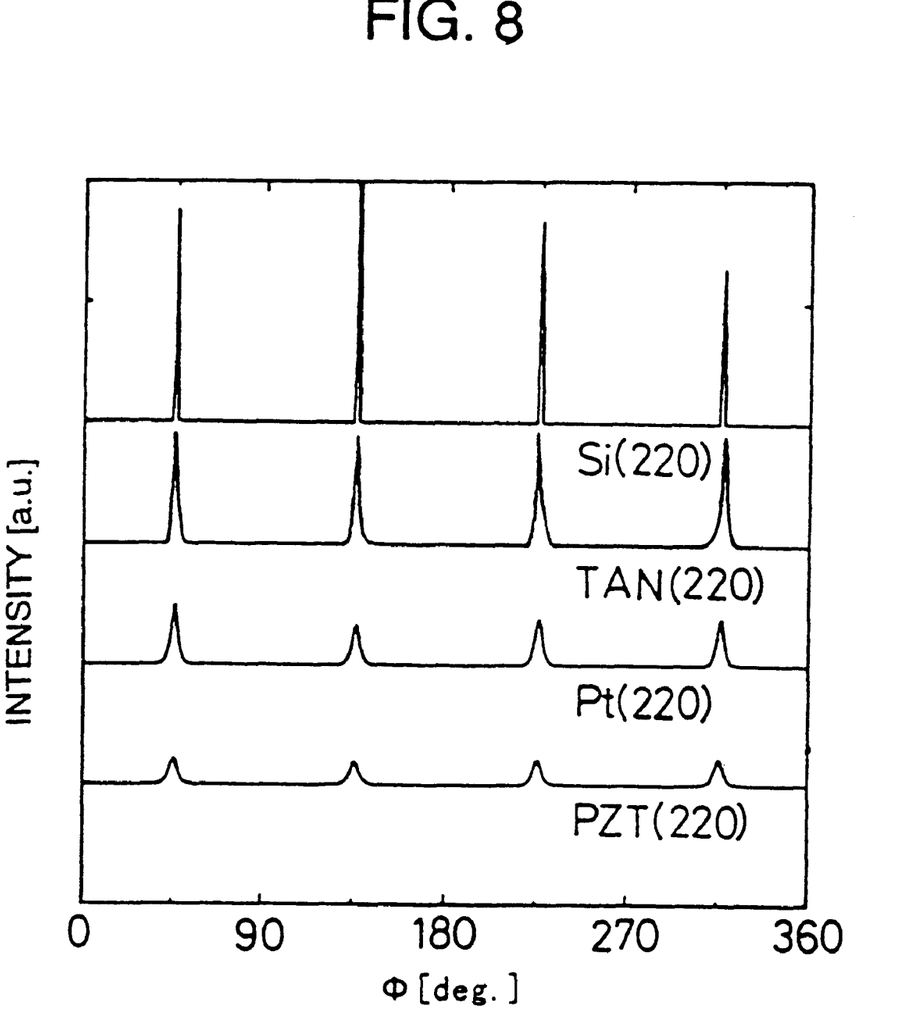
FIG. 8 is a scanning chart of the PZT/Pt/TAN thin films formed in Example 1.

FIG. 8 shows the results of scanning for examining the orientation of the entire multilayer structure comprising PZT/Pt/TAN/Si thin films.

The results indicate that each of the TAN thin film, the Pt thin film and the PZT thin film is epitaxially grown.

Figure 9:
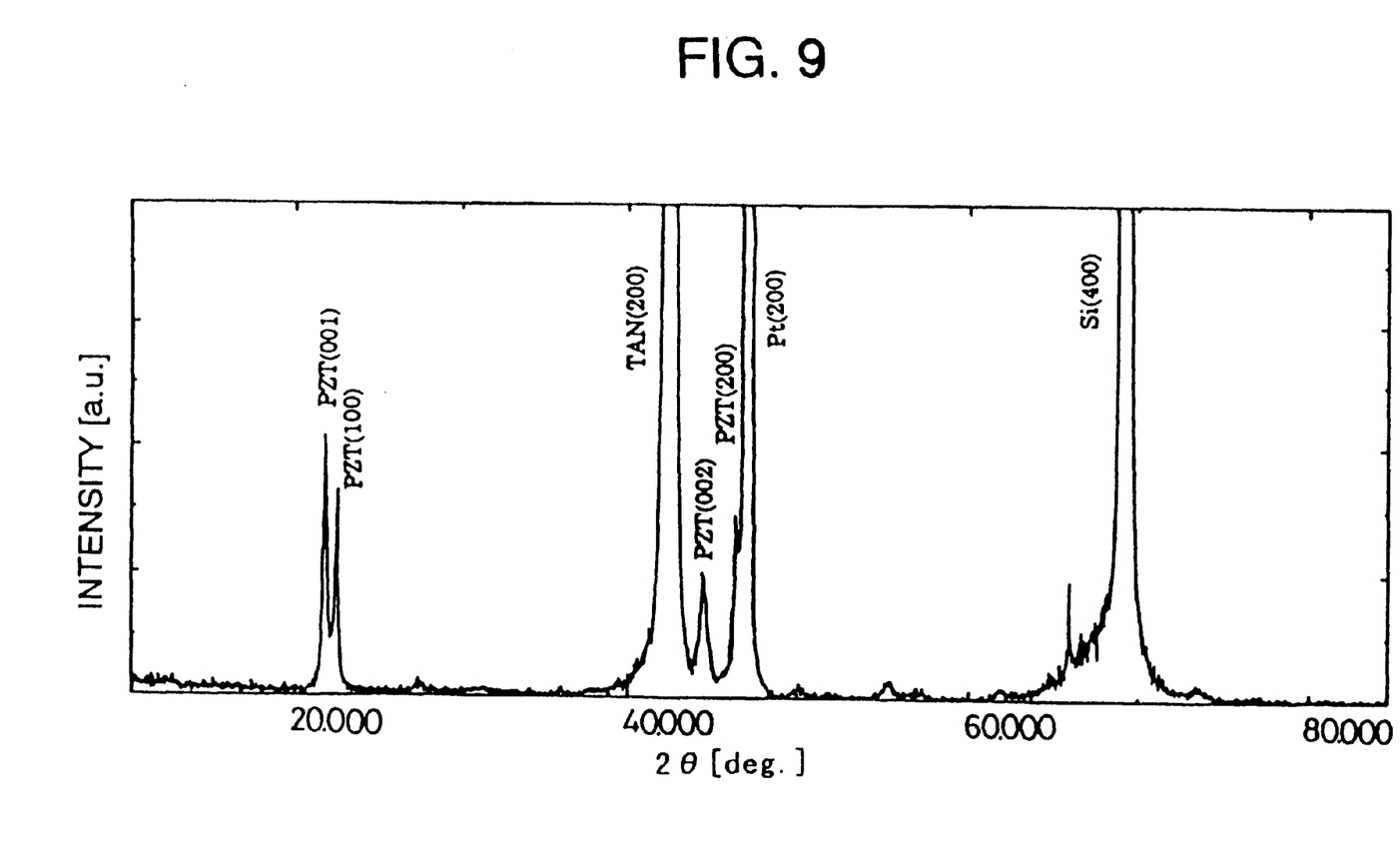
FIG. 9 is a chart showing a XRD pattern of PZT/Pt/TAN thin films formed in Comparative Example 1.

On the other hand, FIG. 9 shows a XRD pattern of the PZT thin film obtained in Comparative Example 1. FIG. 9 reveals that the PZT thin film is a perovskite structure thin film, but shows no tendency to orient in a specified axis, and thus it is not epitaxially grown.

Figure 10:
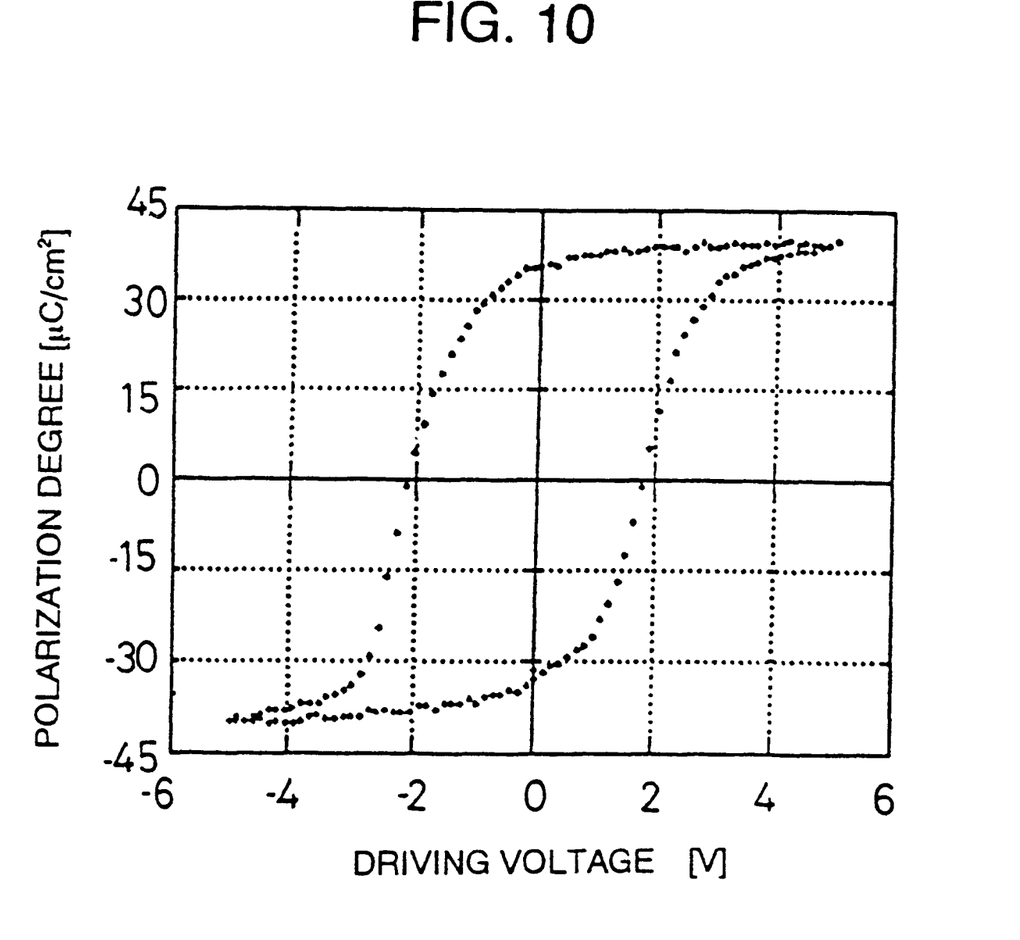
FIG. 10 is a chart showing a P-E hysteresis loop of the epitaxial PZT thin film formed in Example 1 of the present invention.

FIG. 10 shows a P-E hysteresis loop drawn by using the PZT thin film epitaxially grown by the method of Example 1.

Table 2 shows the results of evaluation of electric properties of each of the PZT thin film devices obtained in Example 1 and Comparative Example 1.

TABLE 2

| Sample | tan δ * (%) | Relative dielectric constant * | Remarks |
| --- | --- | --- | --- |
| PZT thin film of Example 1 | 2.1 | 370 | Thickness: 500 nm |
| PZT thin film of Comparative Example 1 | 4.3 | 510 | Thickness: 500 nm |

* tan δ and the relative dielectric constant were measured at 1 kHz and 0.1 V.

Table 2 indicates that the PZT thin film device of Example 1 has good electric properties.

Example 2

A TAN thin film ($Ti_{0.7}Al_{0.3}N$) was epitaxially grown to a thickness of 300 nm on a Si substrate by the same PLD method as Example 1. A Pt thin film was epitaxially grown to a thickness of 100 nm on the TAN thin film by the rf sputtering method, and then a PLT ($Pb_{0.9}La_{0.1}TiO_3$) was epitaxially grown to a thickness of about 600 to 800 nm by the PLD method under conditions including a pressure of 5 Torr ($O^2$ atmosphere), a substrate temperature of 500° C., a laser cycle frequency of 5 Hz, and a laser energy density of 4.5 J/cm² (KrF).

In Example 2, as a target for obtaining the PLT thin film, a ceramic sintered target represented by the composition formula $Pb_{0.9}La_{0.1}TiO_3$ was used.

Figure 11:
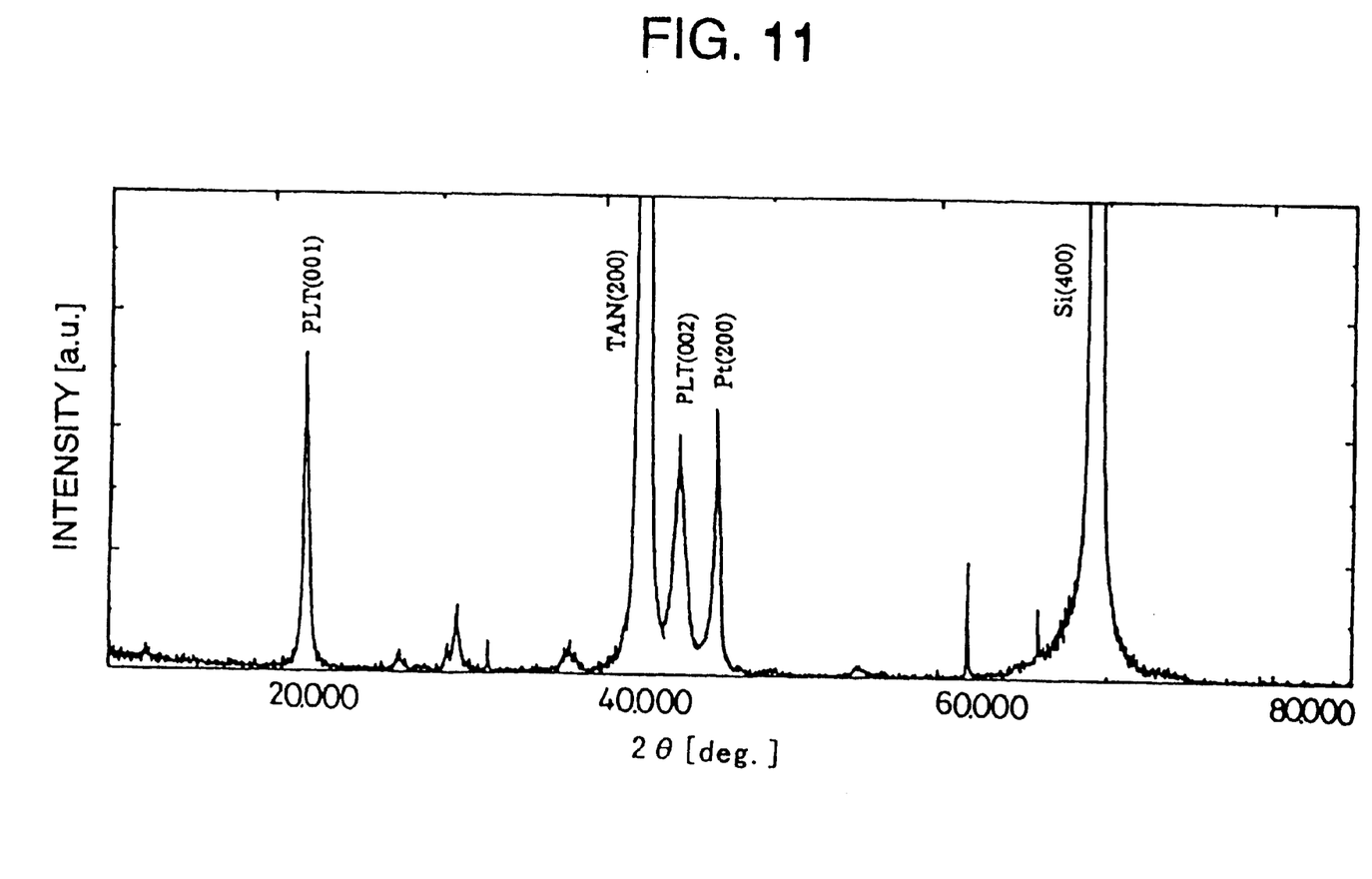
FIG. 11 is a chart showing a XRD pattern of PLT/Pt/TAN thin films formed in Example 2 of the present invention.

FIG. 11 shows a XRD pattern of the thus-obtained epitaxial PLT thin film. FIG. 10 indicates that the use of the method of producing a ferroelectric thin film device of the present invention permits epitaxial growth of the PLT thin film on the Si substrate.

Example 3

A TAN thin film ($Ti_{0.99}Al_{0.01}N$) was epitaxially grown to a thickness of 150 nm on a Si substrate by the same PLD method as Example 1. A Pt thin film was epitaxially grown to a thickness of 50 nm on the TAN thin film by the rf sputtering method, and then a BSTO ($Ba_{0.7}Sr_{0.3}TiO_3$) was epitaxially grown to a thickness of about 50 nm by the PLD method under conditions including a pressure of $10^{-4}$ Torr, a substrate temperature of 600° C., a laser cycle frequency of 5 Hz, and a laser energy density of 4.5 J/cm² (KrF). As a target for obtaining the BSTO thin film, a ceramic sintered target represented by the composition formula $Ba_{0.7}Sr_{0.3}TiO_3$ was used.

Figure 12:
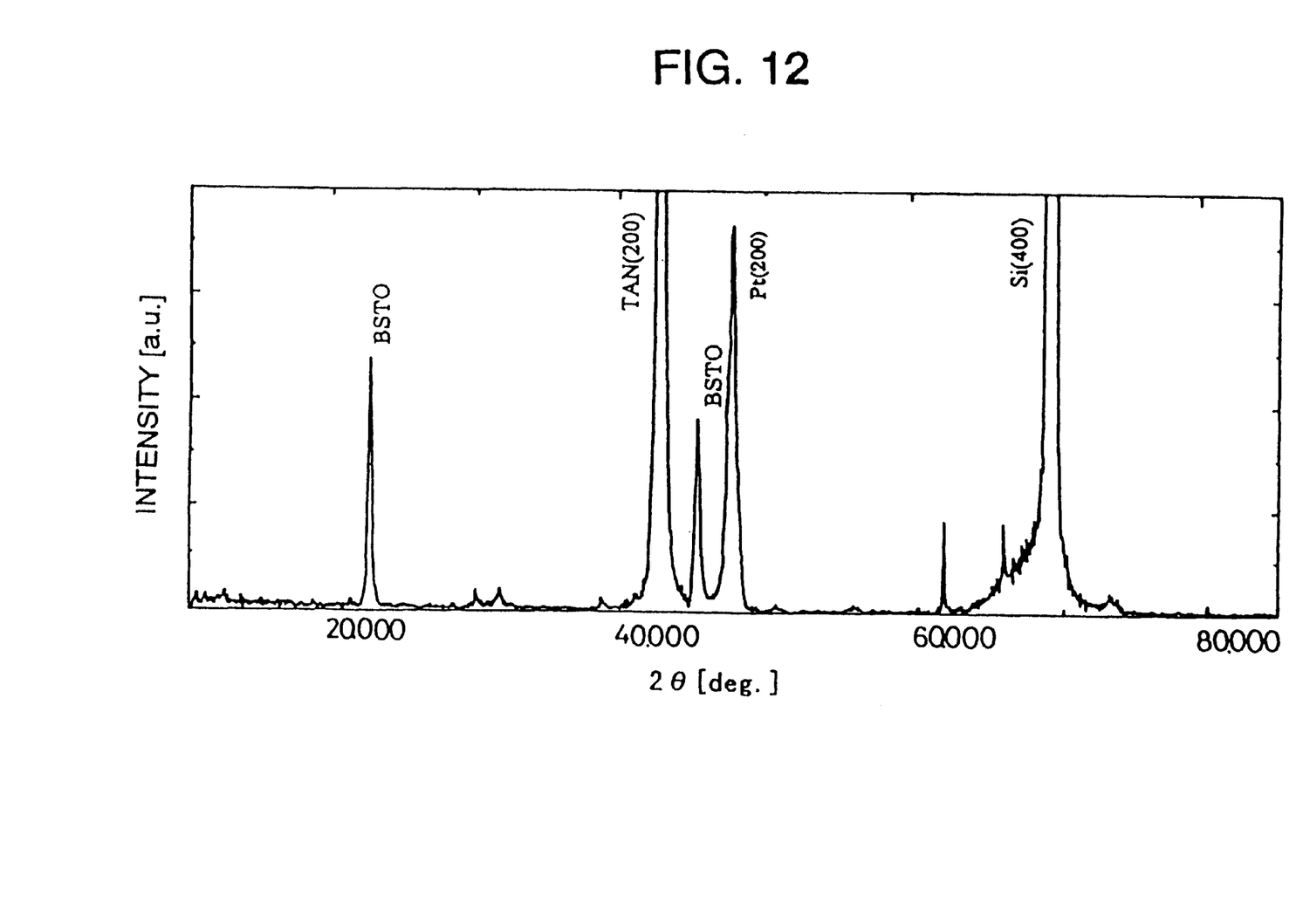
FIG. 12 is a chart showing a XRD pattern of BSTO/Pt/TAN thin films formed in Example 3 of the present invention.
Figure 13:
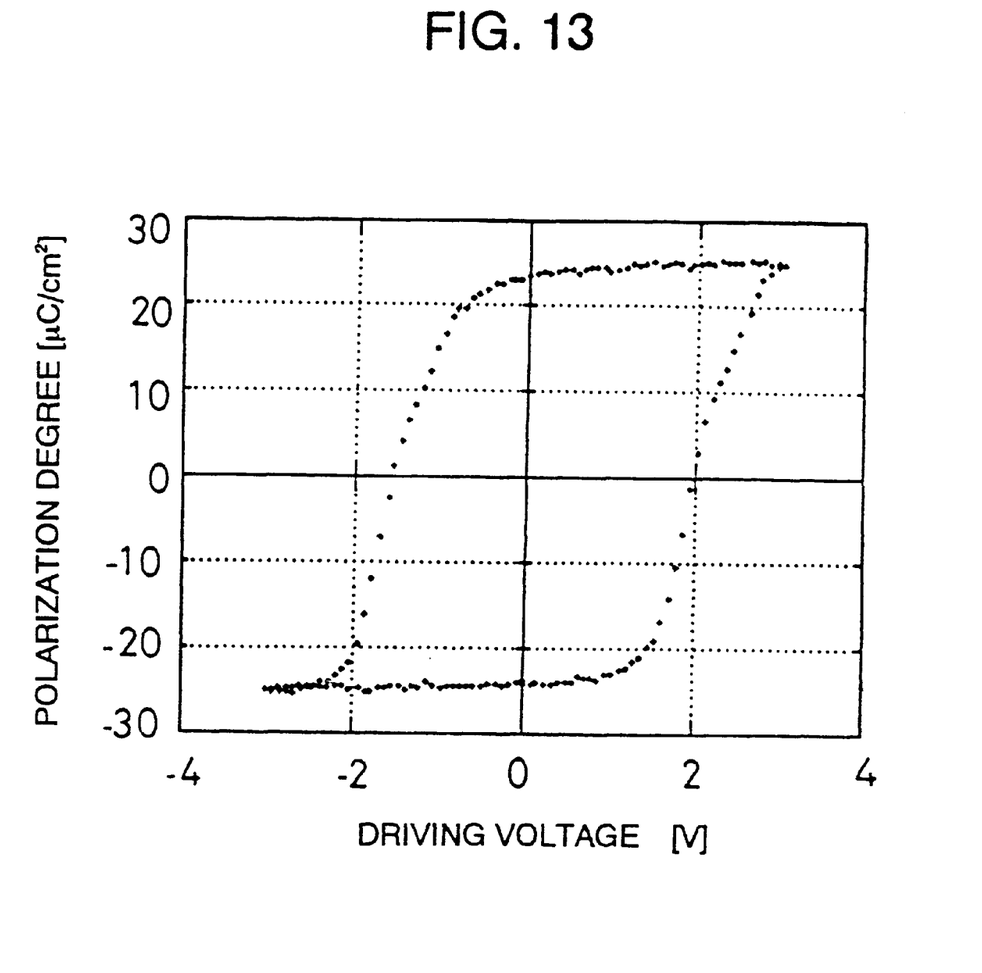
FIG. 13 is a chart showing a P-E hysteresis loop of the epitaxial BSTO thin film formed in Example 3 of the present invention.

FIG. 12 shows a XRD pattern of the thus-obtained epitaxial BSTO thin film. FIG. 13 shows a P-E hysteresis loop drawn by using the epitaxial BSTO thin film. These results indicate that the use of the method of producing a ferroelectric thin film device of the present invention also permits epitaxial growth of the BSTO thin film on the Si substrate.

Example 4

Figure 14A:
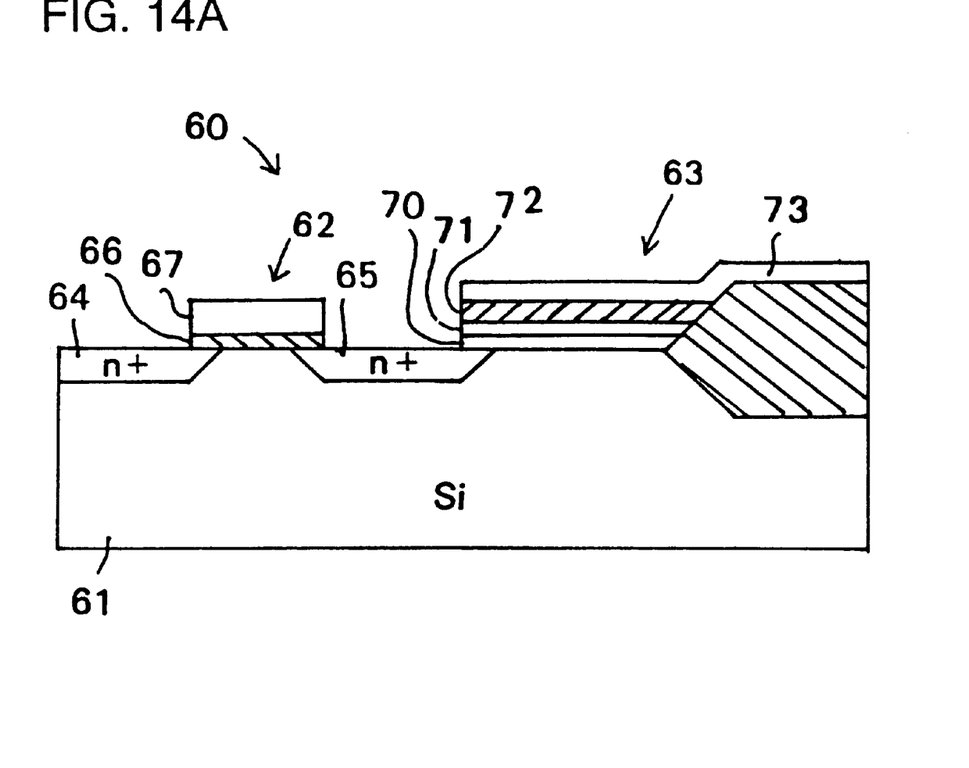
FIG. 14A is a schematic cross sectional view showing a memory device having the ferroelectric thin film device of the present invention.

FIG. 14A schematically shows, in part, a memory device 60 in which the ferroelectric thin film device shown in FIG. 1 is used as a capacitor. As shown in FIG. 14A, The memory device 60 comprises a Si substrate 61, an field effect transistor (FET) 62 and a capacitor 63. The FET 62 includes a source 64 and a drain 65 formed in the Si substrate 61, and a gate 67 formed on the Si substrate 61 via a $SiO_2$ film 66. The gate 67 is used as a word line. The source 64 is connected to a data line.

The capacitor 63 comprises a TiN thin film 70, a Pt thin film 71 on the TiN thin film 70, a PZT thin film 72 on the Pt thin film 71 and upper electrode 73 on the PZT thin film 72. The TiN thin film 70 is formed on the Si substrate 61 so as to electrically contact with the drain 65 and acts as a lower electrode of the capacitor 63.

Figure 14B:
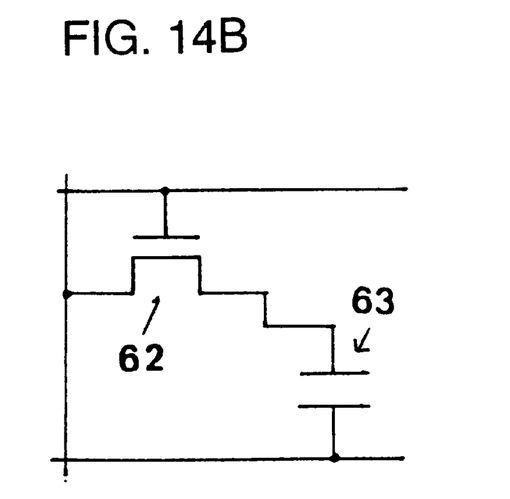
FIGS. 14B and 14C are equivalent circuits of the FIG. 14A device.
Figure 14C:
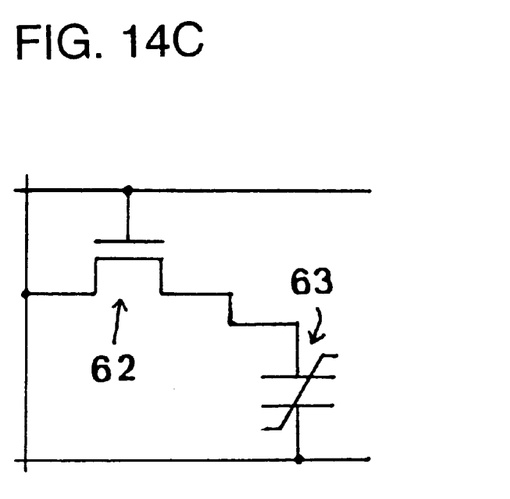

The memory device 60 may be operated as either a dynamic random access memory (DRAM) or a non-volatile memory (FeRAM) in accordance with a driving method and an operation voltage. Equivalent circuits as a DRAM and a FeRAM are shown in FIGS. 14B and 14C, respectively. In either operation, since the PZT thin film 72 having a excellent properties is formed on the Si substrate 61, it is possible to realize a memory device having a excellent device characteristics.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A ferroelectric thin film device comprising:
    a Si substrate;
    an epitaxial TiN thin film on the Si substrate in which the Ti is partially substituted by Al;
    an epitaxial metal thin film on the TiN thin film; and
    an oriented ferroelectric thin film on the metal thin film and composed of an oxide having a perovskite structure;
    wherein the amount of Al substituted at Ti sites in the TiN thin film is about 1 to 30% in terms of Al atoms, and the oxygen content of the TiN thin film is about 5% or less in terms of oxygen atoms.

2. A ferroelectric thin film device according to claim 1, wherein the metal of the metal thin film comprises at least 50% or more of at least one member selected from the group consisting of Au, Pt, Pd, Rh, Ir and Ru.

3. A ferroelectric thin film device according to claim 1, wherein the metal thin film comprises Pt.

4. A ferroelectric thin film device according to claim 3, wherein the Pt thin film is a sputtered film.

5. A ferroelectric thin film device according to claim 3, wherein the ratio of the thickness of the Pt thin film to the thickness of the TiN thin film is about 0.4 or less.

6. A ferroelectric thin film device according to claim 1, wherein the ferroelectric thin film comprises a Pb-containing perovskite oxide thin film.

7. A ferroelectric thin film device according to claim 6, wherein the Pb-containing perovskite oxide is a perovskite oxide represented by $ABO_3$ comprising Pb or Pb and at least La as a component of the A site, and at least one of Ti, Zr, Mg and Nb as a component element of the B site.

8. A ferroelectric thin film device according to claim 7, wherein the ferroelectric thin film is epitaxial.

9. A ferroelectric thin film device according to claim 8, wherein the ferroelectric thin film is a chemical vapor deposition film.

10. A ferroelectric thin film device according to claim 1, wherein the TiN thin film has a thickness in the range of about 100 to 1000 nm, the metal thin film has a thickness in the range of 10 to 200 nm, and the ferroelectric thin film has a thickness in the range of 50 to 3000 nm.

11. A ferroelectric thin film according to claim 1, wherein the ratio of the thickness of the metal thin film to the thickness of the TiN thin film is about 0.5 or less, and the ratio of the thickness of the ferroelectric thin film to the thickness of the TiN thin film is about 3 or less.

12. A ferroelectric thin film device according to claim 1, wherein the TiN thin film is a pulsed laser deposition method film or an ion beam sputtered film.

13. A memory device comprising:
    a capacitor comprising a ferroelectric thin film device of claim 1; and
    a field effect transistor electrically connected to the capacitor.

14. A memory device according to claim 13, wherein the memory device is a dynamic random access memory.

15. A memory device according to claim 13, wherein the memory device is a non-volatile memory.

16. A method of producing a ferroelectric thin film device comprising the steps of:
    epitaxially growing a TiN thin film in which the Ti is partially substituted by Al on a Si substrate;
    epitaxially growing a metal thin film on the TiN thin film; and
    orienting and growing a ferroelectric thin film of an oxide having a perovskite structure on the metal thin film;
    wherein the amount of Al substituted at the Ti sites in the TiN thin film is in the range of about 1 to 30% in terms of Al atoms, and the oxygen content of the TiN thin film is about 5% or less in terms of oxygen atoms.

17. A method of producing a ferroelectric thin film device according to claim 16, wherein the metal thin film is grown to contain about 50% or more of at least one member selected from the group consisting of Au, Pt, Pd, Rh, Ir and Ru.

18. A method of producing a ferroelectric thin film device according to claim 17, wherein the metal thin film grown comprises a Pt thin film.

19. A method of producing a ferroelectric thin film device according to claim 18, wherein the films are grown such that the ratio of the thickness of the Pt thin film to the thickness of the TiN thin film is about 0.4 or less.

20. A method of producing a ferroelectric thin film device according to claim 18, wherein the Pt thin film is formed by sputtering in an Ar gas atmosphere containing about 0.01% by volume or less of oxygen.

21. A method of producing a ferroelectric thin film device according to claim 16, wherein a Pb-containing perovskite oxide thin film is formed as the ferroelectric thin film.

22. A method of producing a ferroelectric thin film device according to claim 21, wherein the Pb-containing perovskite oxide thin film contains Pb or Pb and at least La as a component element of the A site represented by $ABO_3$, and at least one of Ti, Zr, Mg and Nb as a component element of the B site is formed.

23. A method of producing a ferroelectric thin film device according to claim 22, wherein the ferroelectric thin film is epitaxially grown.

24. A method of producing a ferroelectric thin film device according to claim 23, wherein the ferroelectric thin film is formed by the chemical vapor deposition.

25. A method of producing a ferroelectric thin film device according to claim 16, wherein the TiN thin film is grown to a thickness in the range of about 100 to 1000 nm, the metal thin film is grown to a thickness in the range of about 10 to 200 nm, and the ferroelectric thin film is grown to a thickness in the range of about 50 to 3000 nm.

26. A method of producing a ferroelectric thin film device according to claim 16, wherein the films are grown such that the ratio of the thickness of the metal thin film to the thickness of the TiN thin film is about 0.5 or less, and the ratio of the thickness of the ferroelectric thin film to the thickness of the TiN thin film is about 3 or less.

27. A method of producing a ferroelectric thin film device according to claim 16, wherein the TiN thin film is formed by pulsed laser deposition under a pressure of $10^{-6}$ Torr or less, or ion beam sputtering under a pressure of $10^{-3}$ Torr or less.

* * * * *